(12) United States Patent
Tsai

(10) Patent No.: US 10,314,201 B2
(45) Date of Patent: Jun. 4, 2019

(54) LIQUID-COOLED HEAT SINK HEAD AND HEAT SINK SYSTEM HAVING THE SAME

(71) Applicant: COOLER MASTER CO., LTD., New Taipei (TW)

(72) Inventor: Shui-Fa Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 238 days.

(21) Appl. No.: 14/974,798

(22) Filed: Dec. 18, 2015

(65) Prior Publication Data

US 2017/0045306 A1    Feb. 16, 2017

(30) Foreign Application Priority Data

Aug. 11, 2015 (CN) .................... 2015 2 0600573 U

(51) Int. Cl.
*F28D 15/00* (2006.01)
*H05K 7/20* (2006.01)
*H01L 23/473* (2006.01)
*H01L 23/36* (2006.01)
*F28D 21/00* (2006.01)

(52) U.S. Cl.
CPC ......... *H05K 7/20254* (2013.01); *H01L 23/36* (2013.01); *H01L 23/473* (2013.01); *F28D 2021/0028* (2013.01); *F28D 2021/0029* (2013.01)

(58) Field of Classification Search
CPC ........... H01L 23/473; F28D 2021/0028; F28D 2021/0029

USPC ......................................... 165/172, 173, 174
See application file for complete search history.

(56) References Cited

U.S. PATENT DOCUMENTS 5,957,194 A * 9/1999 Azar ..................... F28F 3/02
165/185
2005/0217829 A1* 10/2005 Belits ................. F28D 15/0266
165/104.33

FOREIGN PATENT DOCUMENTS

TW         M470293 U      1/2014

* cited by examiner

*Primary Examiner* — Keith M Raymond
*Assistant Examiner* — Nael N Babaa
(74) *Attorney, Agent, or Firm* — Maschoff Brennan

(57) ABSTRACT

A liquid-cooled heat sink head includes a metal substrate, a first cover, and a plurality of heat dissipation fins. The first cover covers the metal substrate to form a heat exchange chamber and includes a first liquid inlet and a liquid outlet to allow a working fluid to flow in the heat exchange chamber. The heat dissipation fins are disposed on the metal substrate, are placed between the first liquid inlet and the liquid outlet, and are arranged sequentially from the first liquid inlet toward the liquid outlet. A liquid passage is disposed between each two adjacent heat dissipation fins. A portion of the heat dissipation fins are connected to the heat exchange portion, and at least one heat dissipation fin includes one opening to communicate with the liquid passages at two sides of the at least one heat dissipation fin.

13 Claims, 11 Drawing Sheets

LIQUID-COOLED HEAT SINK HEAD AND HEAT SINK SYSTEM HAVING THE SAME

TECHNICAL FIELD

The present invention relates to a heat sink head and, in particular, to a liquid-cooled heat sink head and a heat sink system having the same, which prevents a working fluid from being obstructed by a heat dissipation fin.

BACKGROUND

Along with development of technology, electric components in the electronic products are further miniaturized with higher integration density and enhanced operation efficiency. Therefore, there have been demands for heat sinks having sufficient cooling ability in small space, so that temperatures of the electric components in the electronic devices can be maintained in proper ranges to facilitate heat exchange between the electric devices and the ambient environment to thereby protect the electric components and prevent the electric components and the electric products from being damaged due to overheating.

In conventional techniques, there are two types of heat dissipation methods, i.e. air-cooled and liquid-cooled heat dissipation methods. The air-cooled heat dissipation method utilizes a cooling device to dissipate heat of the components of the electronic devices. The conventional cooling device includes a body having a plurality of heat dissipation fins, and a fan is usually added and secured onto the heat dissipation fins to improve heat dissipation efficiency. When using the conventional cooling device, a bottom of the body is attached to a heating element, such as a central processing unit (CPU) or a graphic processing unit (GPU), which generates a great amount of waste heat, the heat is transferred from the body to the heat dissipation fins by thermal conduction, and then the waste heat is expelled by airflow generated by the fan, thereby cooling the heating element.

However, it is more and more difficult for the conventional air-cooled heat sink to satisfy the cooling demands for the foregoing electronic components, so the liquid-cooled heat sink is adopted increasingly. The conventional heat sink is constituted by spread-apart elements. For example, R.O.C patent no. M470293 discloses a liquid-cooled heat sink module comprising a pump and a heat dissipation element. The pump includes a housing, a centrifugal fan and a flow directing structure. The housing includes a chamber for entry of a fluid. The flow directing structure includes an opening and a plurality of pressure blades. The flow directing structure is provided for the fluid flowing out from around the blades. Since the fluid of the heat sink module has a long flowing path and is obstructed by the heat dissipation fins, the heat exchange efficiency is compromised. Furthermore, the foregoing flowing path includes at least three bends, and consequently a flowing speed is slowed down, and a great amount of kinetic energy is reduced. As a result, the fluid fails to flow to a root portion (i.e. where the heating element is) of each heat dissipation fin properly, and the heat dissipation efficiency is compromised.

Accordingly, the aim of this disclosure is to solve the above-mentioned problems, which industry in related fields has attempted to solve, by improving the conventional diversion design liquid-cooled heat sink.

SUMMARY

It is an object of the present invention to provide a liquid-cooled heat sink head and a heat sink system having the same whereby a working fluid performs heat exchange close to a heating element (i.e. a heat source) without being obstructed by a heat dissipation fin.

It is another object of the present invention to provide a liquid-cooled heat sink head and a heat sink system having the same wherein a flowing path of a working fluid has less bends so that a flowing speed is not slowed down, and a kinetic energy of the working fluid is less reduced, thereby improving heat dissipation efficiency.

Accordingly, the present invention provides a liquid-cooled heat sink head having a heat exchange portion adapted to contact a heating element. The liquid-cooled heat sink head includes a metal substrate, a first cover and a plurality of heat dissipation fins. The metal substrate includes the heat exchange portion. The first cover covers the metal substrate to form a heat exchange chamber. The first cover includes a first liquid inlet and a liquid outlet to allow a working fluid to flow in the heat exchange chamber. Each of the heat dissipation fins is disposed on the metal substrate and in the heat exchange chamber. The heat dissipation fins are disposed between the first liquid inlet and the liquid outlet and are arranged sequentially from the first liquid inlet toward the liquid outlet. A liquid passage is disposed between each two adjacent heat dissipation fins. At least a portion of the heat dissipation fins are connected to the heat exchange portion, and at least one heat dissipation fin includes an opening through which the liquid passages at two sides of the at least one heat dissipation fin communicate with each other. The at least one heat dissipation fin having the opening is disposed close to the first liquid inlet.

In another broad embodiment, the present invention provides a heat sink system comprising the liquid-cooled heat sink head mentioned in the foregoing embodiment, a plurality of pipes, and a cooling device. At least a portion of the pipes are connected to the first liquid inlet and the liquid outlet respectively. The cooling device is connected to the liquid-cooled heat sink head via the pipes to further cool the heat exchanged working fluid.

The present invention further includes following effects. The first cover of the liquid-cooled heat sink head can limit the working fluid to flow downward to the through hole formed by the opening of the heat dissipation fin, and then to the liquid passages, and thereafter the working fluid is converged toward the passageway. Therefore, a flowing path of the working fluid has less bends, so that kinetic energy of the working fluid is not reduced and a flowing speed of the working fluid is not slowed down, thereby improving heat dissipation efficiency. Furthermore, the working fluid quickly flow by a root portion/bottom (i.e. being close to a heat source) of each heat dissipation fin via the through hole, and consequently, the waste heat of the heat source can be transferred away quickly to enhance heat dissipation capability.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Figure 1:
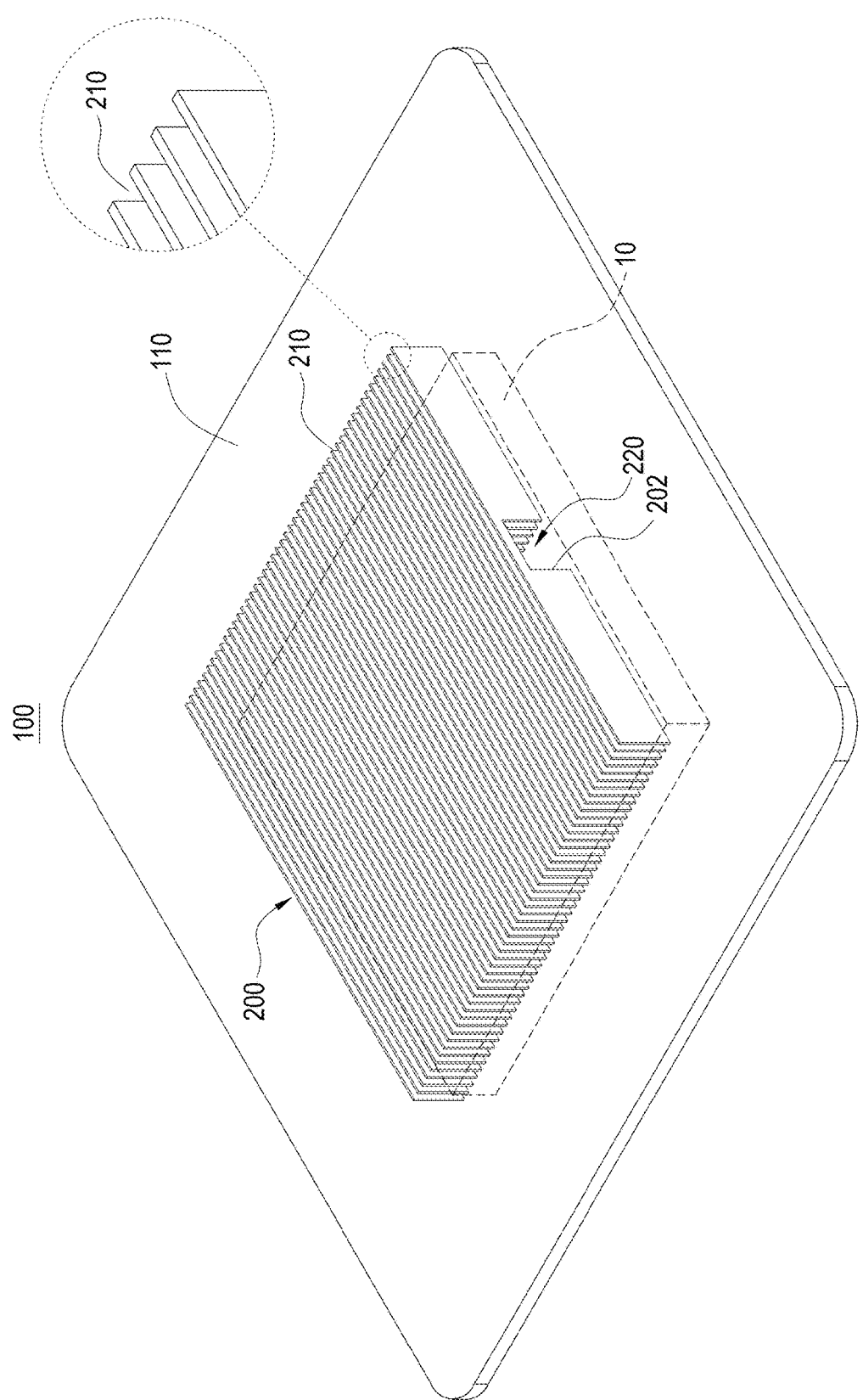
FIG. 1 is a perspective view illustrating a first preferable embodiment (a first cover is not installed yet) of the present invention.
Figure 2:
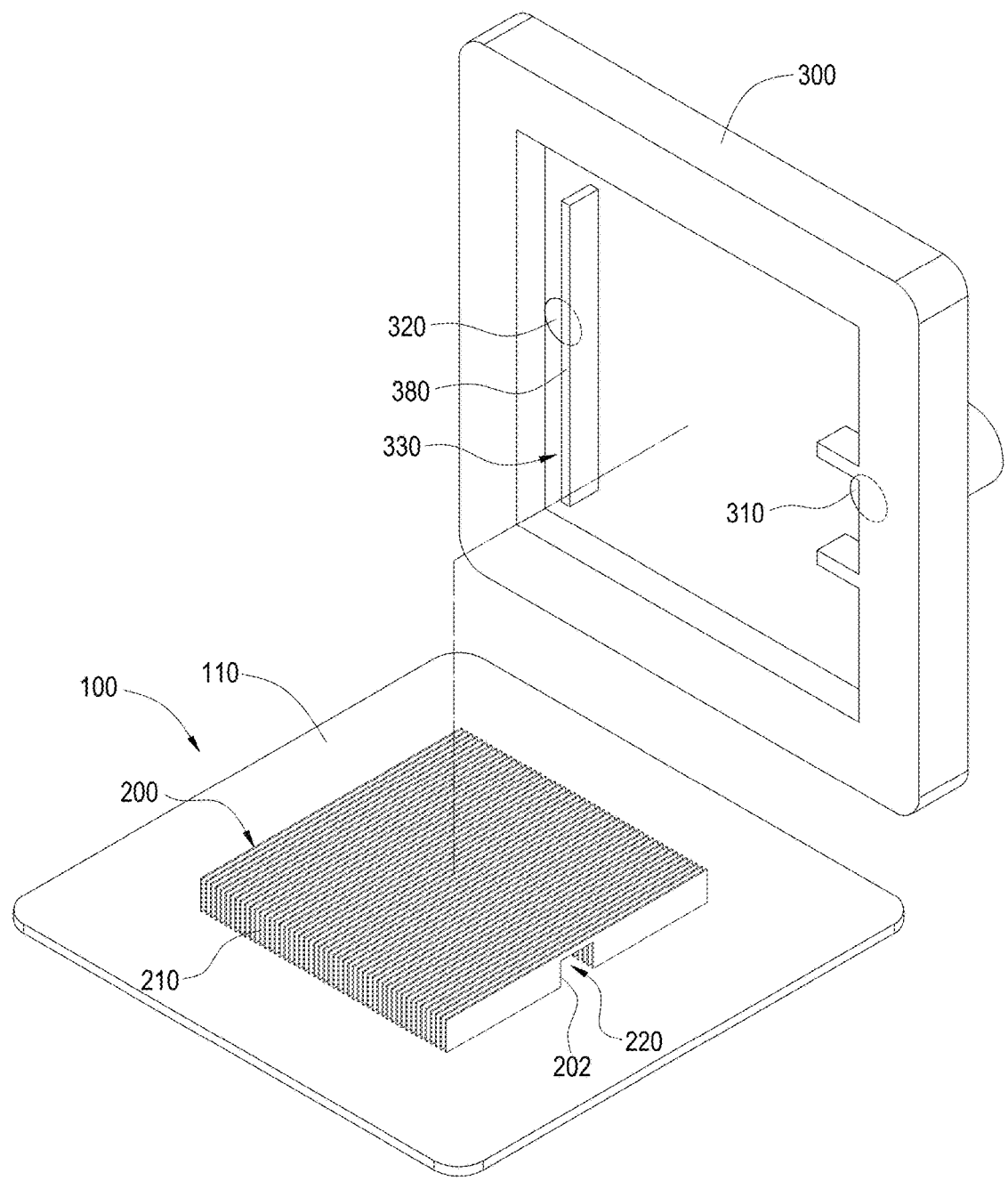
FIG. 2 is an exploded view illustrating the first preferable embodiment of the present invention.
Figure 3:
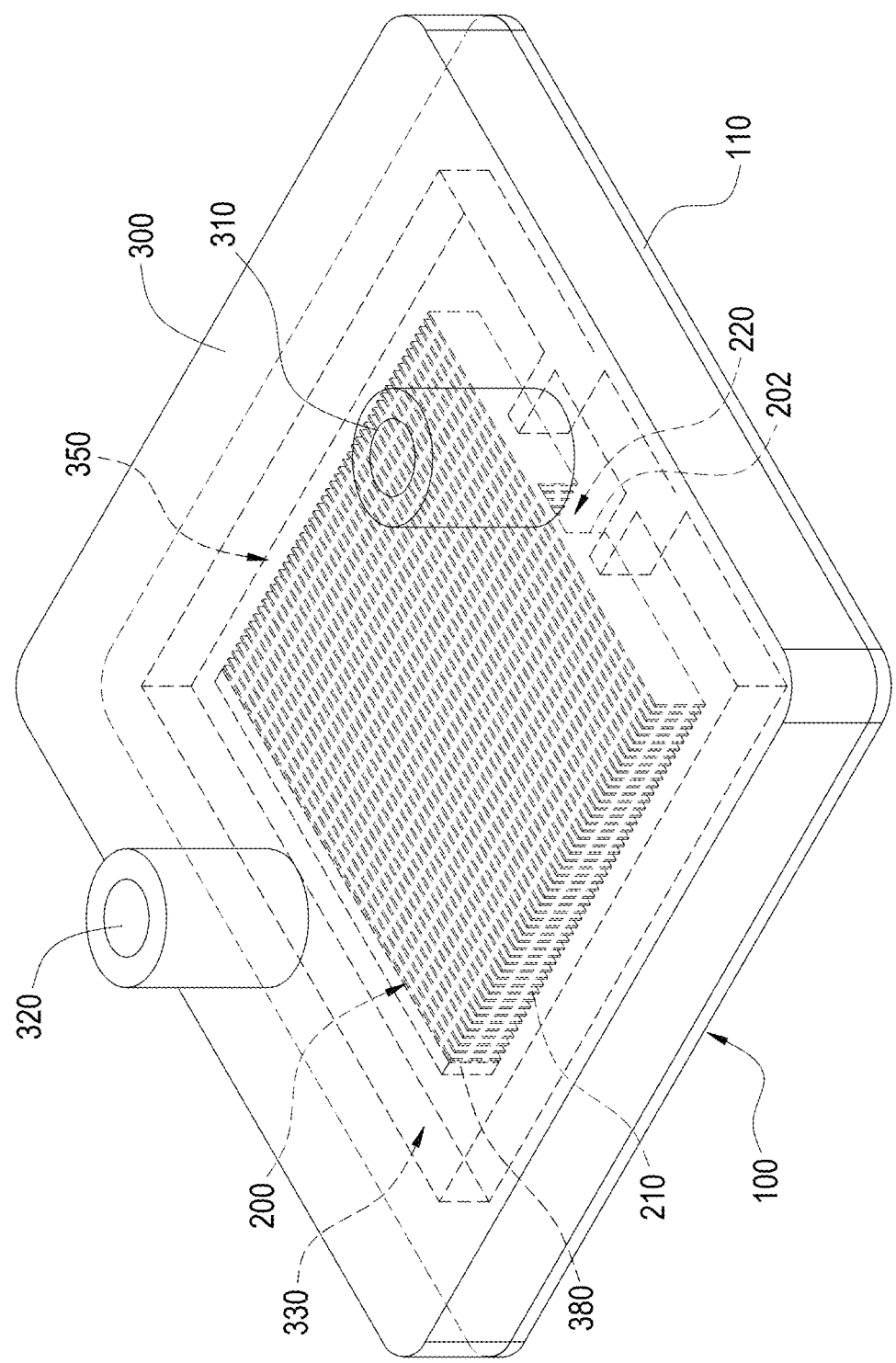
FIG. 3 is a perspective view illustrating the first preferable embodiment (the first cover is installed) of the present invention.

The present invention relates to a liquid-cooled heat sink head and a heat sink system having the same, which can quickly transfer away the heat generated from a heat source. The present invention can be applied to a television, a computer, an electric motor, a mobile device, a display device, or other electronic products, and the present invention is not limited in this regard. Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Please refer to FIGS. 1 to 5 which are a perspective view, an exploded view, and a cross-sectional view of a first preferable embodiment of the present invention. In the present embodiment, the present invention provides a liquid-cooled heat sink head 100 having a heat exchange portion (e.g. a copper plate) for contacting a heating element 10. The heating element 10 includes, for example, a central processing unit, a graphics processing unit, or other electric element. The liquid-cooled heat sink head 100 includes a metal substrate 110, a first cover 300, and a plurality of heat dissipation fins 200. The metal substrate 110 is disposed with the heat exchange portion (not illustrated) thereon. The substrate 110 as referred herein being made of, but is not limited to, copper, aluminum, or their alloy. Certainly, in other embodiment, the substrate 110 can be made of other suitable materials.

Referring to FIGS. 2 to 5, the first cover 300 covers the metal substrate 110 to form a heat exchange chamber 330. The first cover 300 includes a first liquid inlet 310 and a liquid outlet 320 to allow a working fluid 370 to flow in the heat exchange chamber 330. Preferably, the working fluid 370 is water, silicone oil, mineral oil, or a combination thereof.

Each of the heat dissipation fins 200 is disposed on the metal substrate 110 and is placed in the heat exchange chamber 330. The heat dissipation fins 200 are disposed between the first liquid inlet 310 and the liquid outlet 320 and are arranged sequentially from the first liquid inlet 310 toward the liquid outlet 320. It is preferable that the heat dissipation fins 200 are integrally formed with the metal substrate 110; however, in other different embodiments, the heat dissipation fins 200 can be fixed onto the metal substrate 110 by welding or other suitable methods, and the present invention is not limited in this regard.

A liquid passage 210 is disposed between each two adjacent heat dissipation fins 200. In the embodiment shown in FIG. 1, a distance between any two adjacent liquid passages 210 ranges from, but is not limited to, 0.1 to 0.3 millimeter, wherein at least a portion of the heat dissipation fins 200 are connected to the heat exchange portion (not illustrated). Furthermore, at least one heat dissipation fin 200 includes an opening 202 through which the liquid passages 210 at two sides of the at least one heat dissipation fin 200 communicate with each other. The at least one heat dissipation fin 200 having the opening 202 is disposed close to the first liquid inlet 310. In the present embodiment, each of the heat dissipation fins 200 includes the opening 202, the opening 202 of each of the heat dissipation fins 200 is substantially in the same position to form a through hole passing through the heat dissipation fins 200.

Furthermore, the first heat dissipation fin 200 is disposed close to the first liquid inlet 310, and the last heat dissipation fin 200 is disposed close to the liquid outlet 320 opposite to the first heat dissipation fin 200. The first cover 300 includes a stop plate 380, the stop plate 380 is disposed between the last heat dissipation fin 200 and the liquid outlet 320, and the stop plate 380 extends from an inner top surface of the first cover 300 toward the heat exchange chamber 330 to cover the opening 202 of the last heat dissipation fin 200. In the present embodiment, it is preferable that the opening 202 is rectangular or circular in shape, and one side of the opening 202 is connected to the metal substrate 110, so that the working fluid 370 can directly flow downward to the through hole 220, without being obstructed by any heat dissipation fin 200, to transfer away the waste heat of the heating element (not illustrated).

Figure 6:
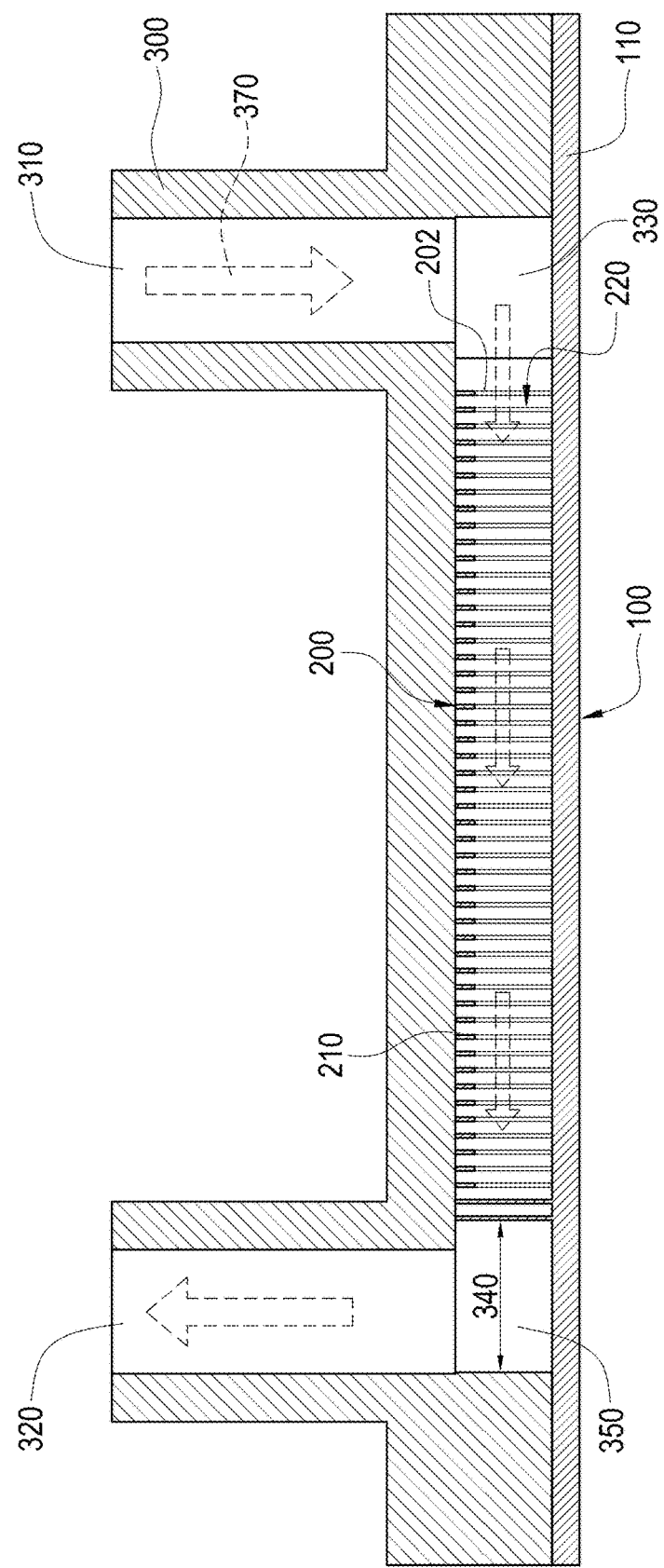
FIG. 6 is a cross-sectional view illustrating a second preferable embodiment of the present invention.
Figure 7:
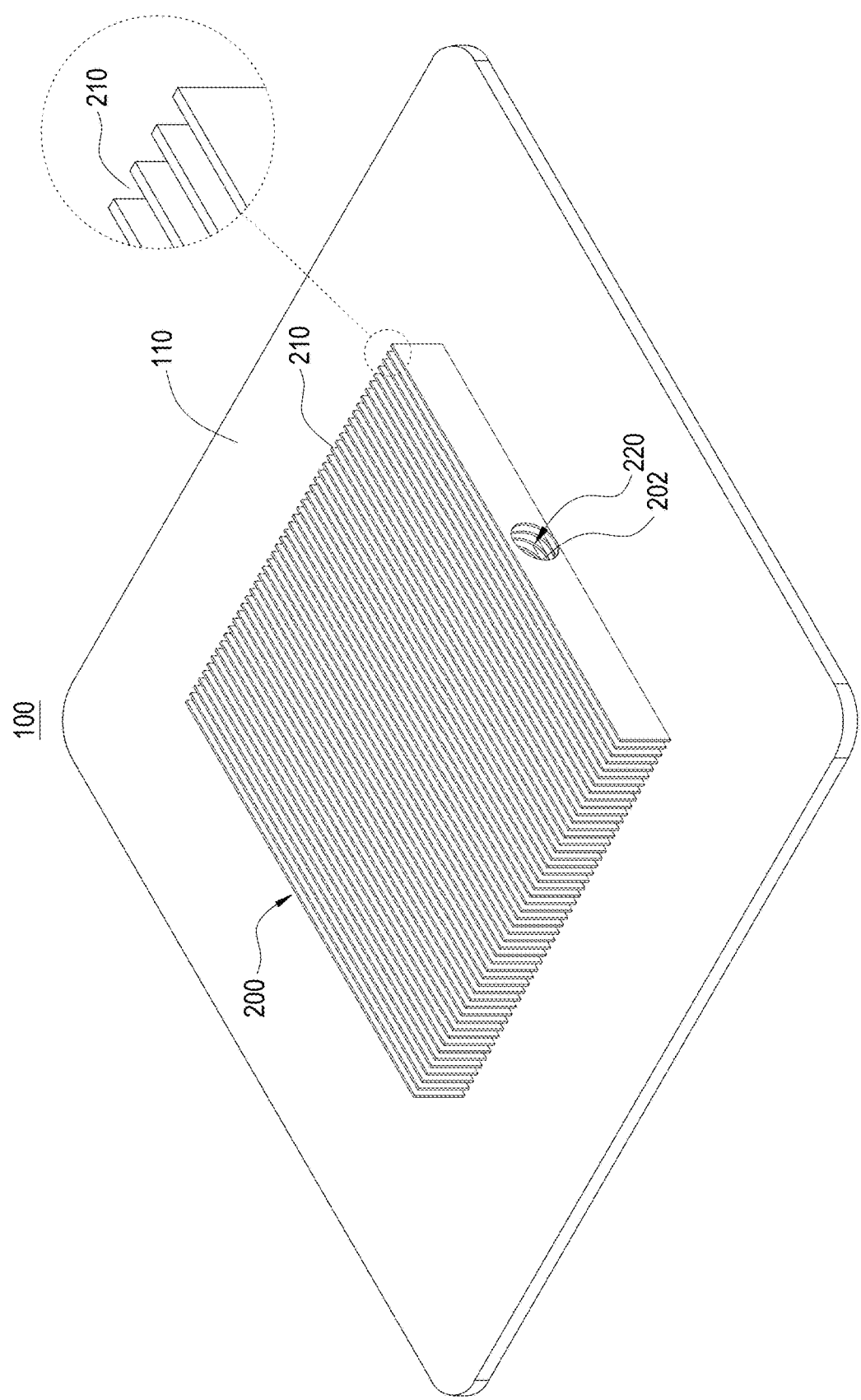
FIG. 7 is a schematic view illustrating an opening of the present invention according to another embodiment.
Figure 8:
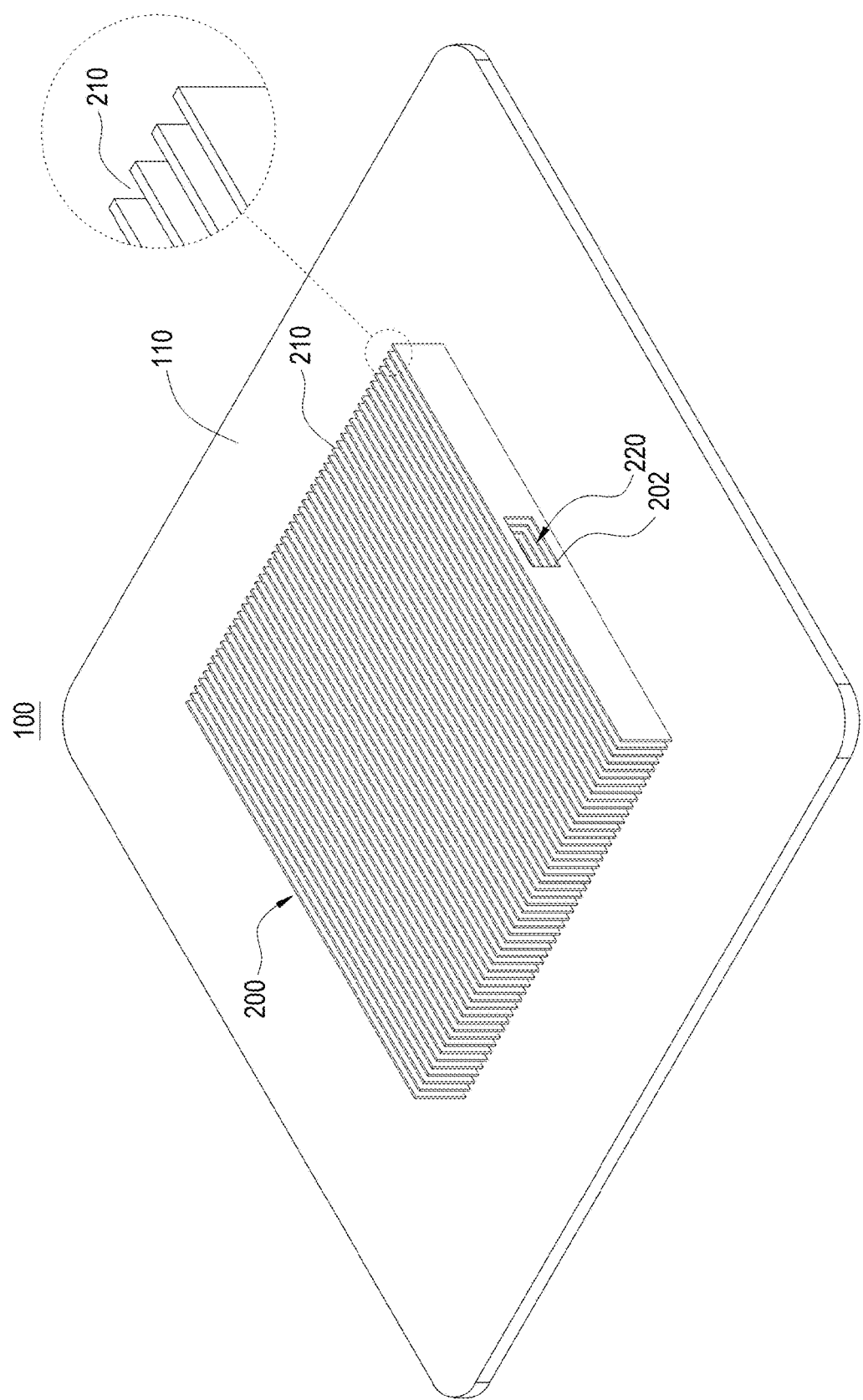
FIG. 8 is a schematic view illustrating the opening of the present invention according to still another embodiment.

However, in the embodiment shown in FIG. 7, the opening 202 can also have a circular shape or other suitable shape. Furthermore, in the embodiment shown in FIG. 8, the opening 202 can be formed in a closed shape in the heat dissipation fin 200, and the present invention is not limited in this regard. Moreover, in the embodiment shown in FIG. 6, the first heat dissipation fin 200 is disposed close to the first liquid inlet 310, the last heat dissipation fin 200 is disposed close to the liquid outlet 320 opposite to the first heat dissipation fin 200, and at least the last heat dissipation fin 200 or some heat dissipation fins 200 include no opening 202, so that the working fluid 370 flows to each of the liquid passages 210.

Figure 4:
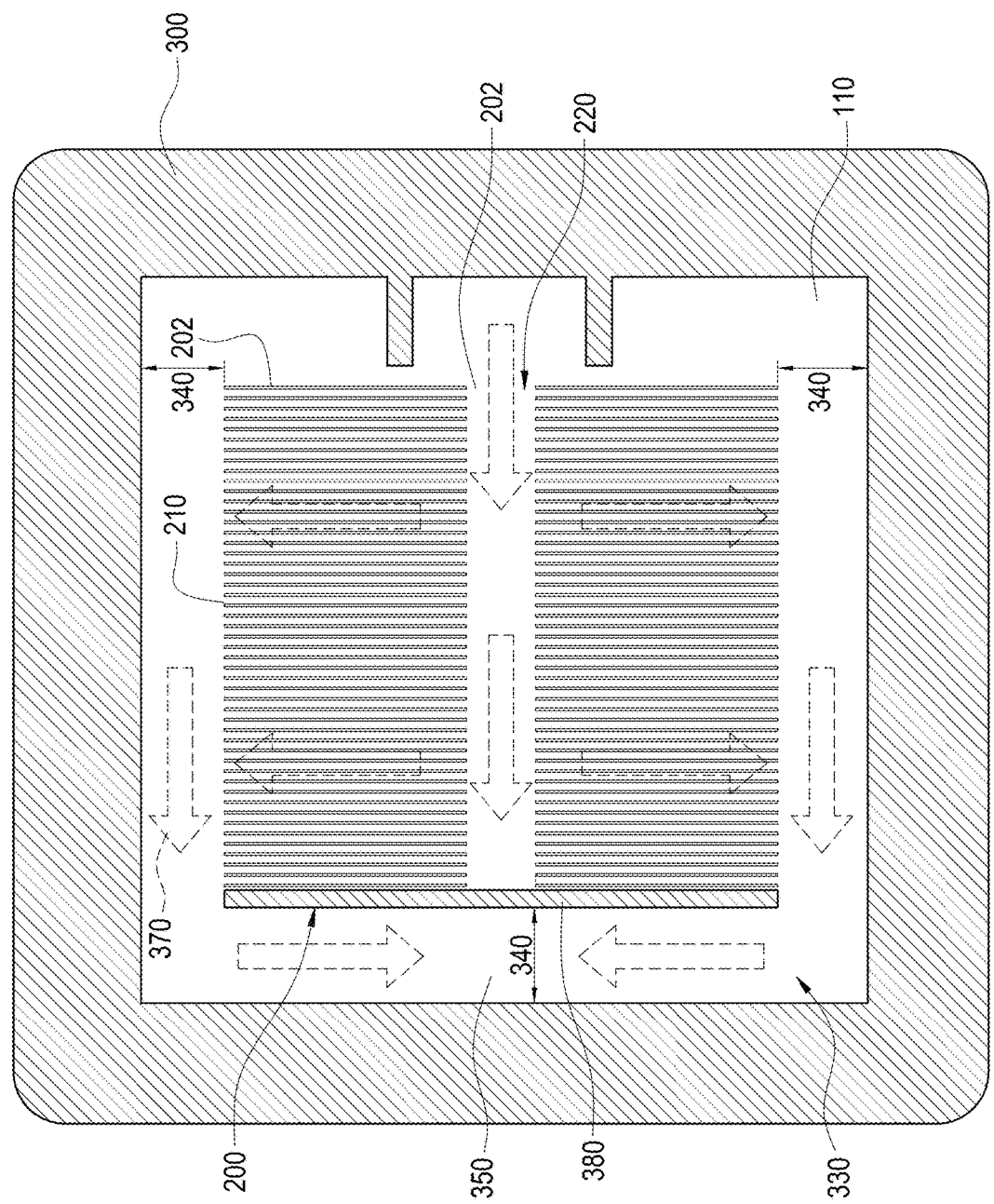
FIG. 4 is a cross-sectional view illustrating the first preferable embodiment of the present invention.
Figure 5:
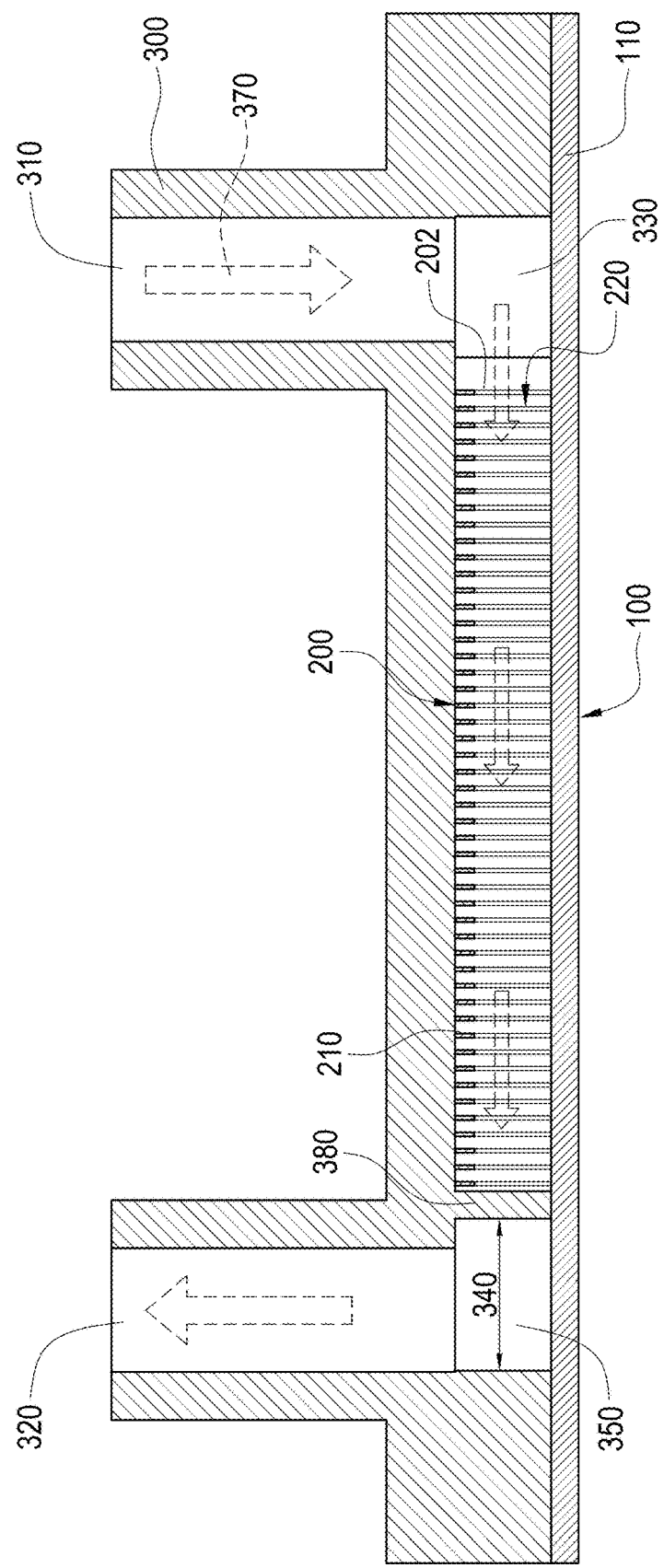
FIG. 5 is another cross-sectional view of the present invention, illustrating FIG. 3 from another viewing angle.

As shown in FIGS. 4 and 5, at least one side of the heat dissipation fins 200 is spaced apart from an inner surface of the first cover 300 at the same side with a predetermined distance 340 so as to form a passageway 350 in the heat exchange chamber 330. When the working fluid 370 flows into the through hole 220, due to being obstructed by the stop plate 380 or the heat dissipation fin 200 having no opening 202, the working fluid 370 can flow out to the passageway 350 from the liquid passage 210 at two sides of the through hole 220. Therefore, by utilizing the heat dissipation fins 200 to cover the whole heating element (not illustrated), the working fluid 370 can quickly transfer away the waste heat generated by the heating element, thereby achieving quick heat dissipation.

Figure 9:
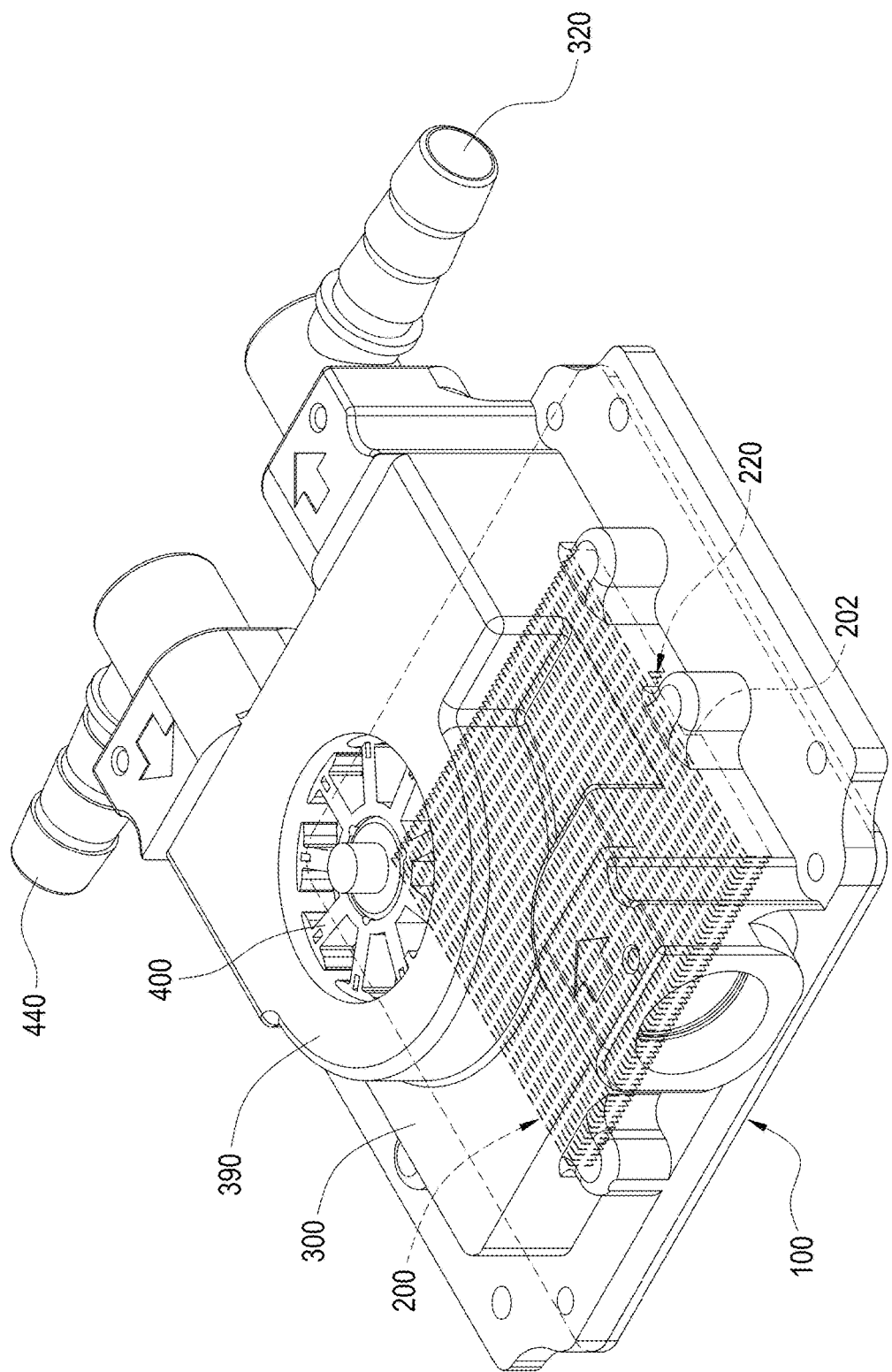
FIG. 9 is a semi-transparent perspective view illustrating the second preferable embodiment of the present invention.
Figure 10:
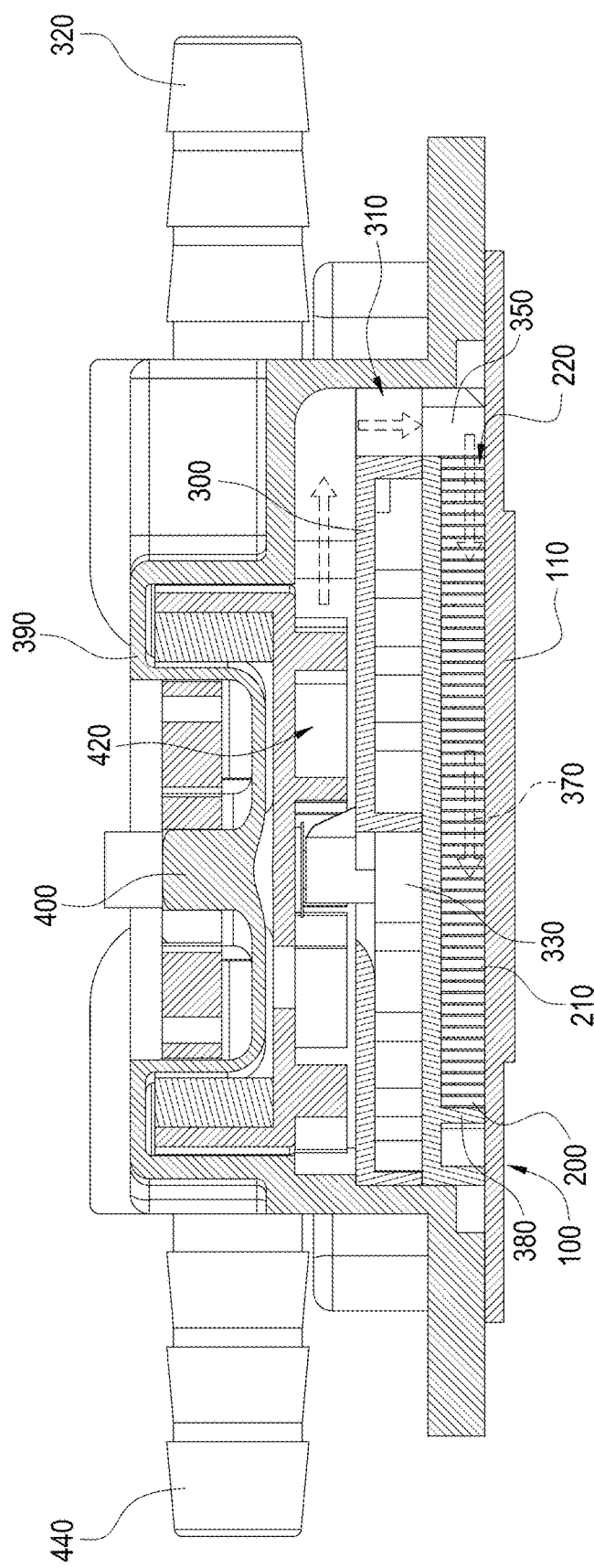
FIG. 10 is a cross-sectional view illustrating the second preferable embodiment of the present invention.

Please refer to FIGS. 9 and 10 which are a perspective view and a cross-sectional view according to a second preferable embodiment of the present invention. This embodiment further includes a second cover 390 and a rotating wheel unit 400. The second cover 390 covers the first cover 300 to form a pump chamber 420. The pump chamber 420 communicates with the heat exchange chamber 330 via the first liquid inlet 310. The second cover 390 includes a second liquid inlet 440 to allow the working fluid 370 to flow into the pump chamber 420 from the second liquid inlet 440. The rotating wheel unit 400 is disposed in the pump chamber 420 to forcibly direct the working fluid 370 in the pump chamber 420 into the heat exchange chamber 330 via the first liquid inlet 310. The rotating wheel unit 400 as referred herein is preferably a pump.

In the present embodiment, the working fluid 370 flows to the pump chamber 420 from blades of the rotating wheel unit 400, then it flows through the first liquid inlet 310, and after that it flows into the through hole 220 of the heat dissipation fin 200. Therefore, there are only two bends in a flowing path of the working fluid 370. As a result, kinetic energy of the working fluid 370 is less reduced, and a flowing speed of the working fluid 370 is more stable, so the waste heat generated by the heating element (not illustrated) can be transferred away efficiently by the working fluid 370.

Figure 11:
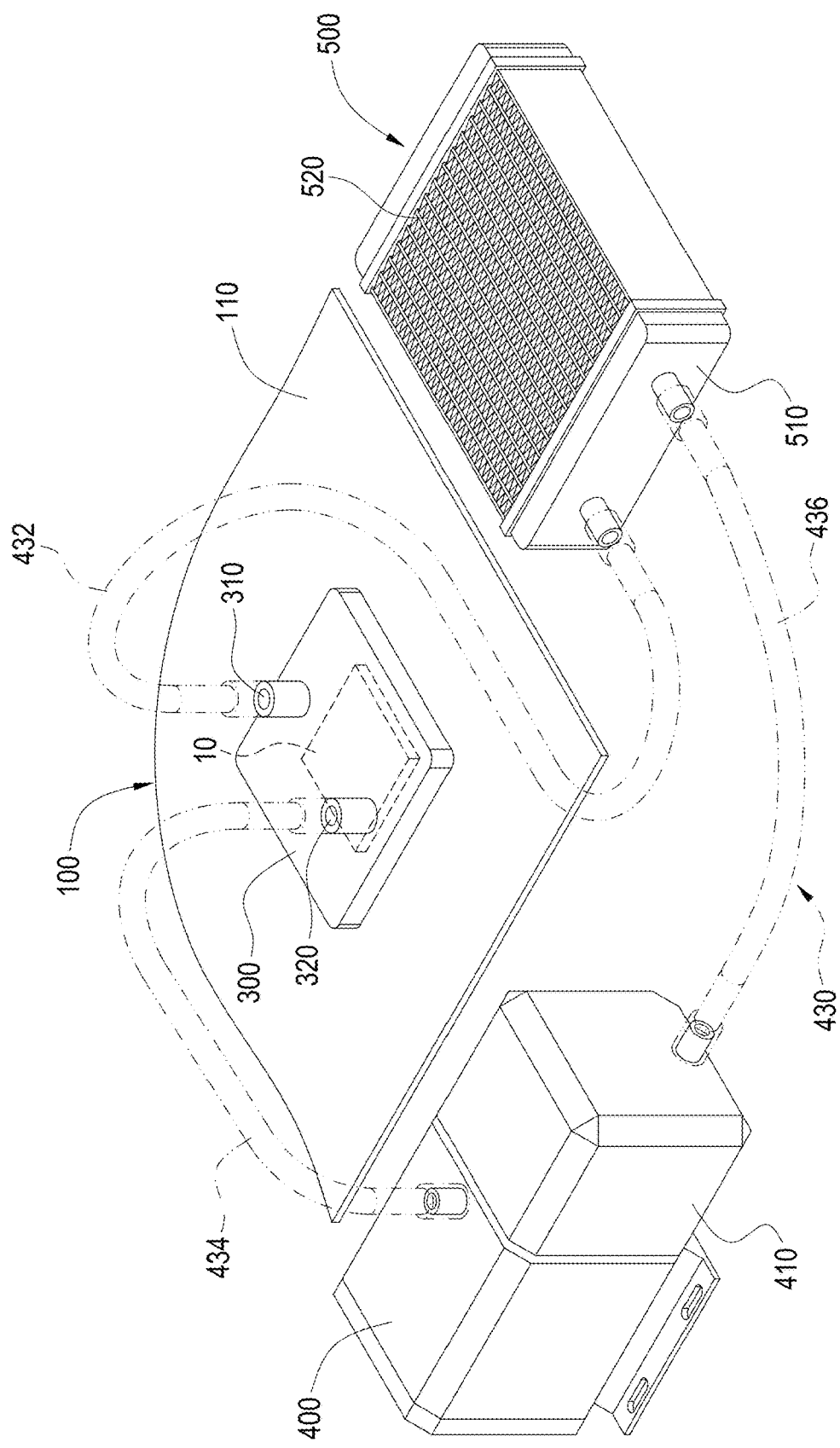
FIG. 11 is a perspective view illustrating a third embodiment of the present invention.

The present invention provides a heat sink system in another broad embodiment, as shown in FIG. 11 which illustrates a third embodiment of the present invention. The heat sink system of the present invention includes the liquid-cooled heat sink head 100 in the above-mentioned embodiments, a plurality of pipes 430, a cooling device 500. At least a portion of the pipes 430 are connected to the first liquid inlet 310 and the liquid outlet 320 respectively. The cooling device 500 is connected to the liquid-cooled heat sink head 100 via the pipes 430 to further cool the heat exchanged working fluid (not illustrated).

Referring to FIG. 11, the heat sink system further includes a rotating wheel unit 400 connected to the liquid-cooled heat sink head 100 via the at least a portion of the pipes 430 to forcibly direct the working fluid (not illustrated) into the heat exchange chamber 420. As shown in the drawing, each pipe 430 further includes an inlet pipe 432, an outlet pipe 434, and a joint pipe 436 connected to the cooling device 500 and the rotating wheel unit 400. The inlet pipe 432 is connected to the heat sink device 500 and the first liquid inlet 310, and the liquid outlet 434 is connected to the rotating wheel unit 400 and the liquid outlet 320, so the working fluid 370 can be circulated.

In the present embodiment, the rotating wheel unit 400 which is preferably a pump further includes a tank 410 for accommodating the working fluid 370. The joint pipe 436 is connected to the cooling device 500 and the tank 410. The cooling device 500 includes a heat exchange chamber 510 and a plurality of heat dissipation fins 520 disposed vertically in the heat exchange chamber 510. By this configuration, the high temperature working fluid 370 can be cooled to a low temperature, and then flows into the liquid-cooled heat sink head 100 to complete a liquid-cooled heat dissipation circulation.

When the rotating wheel unit 400 directs the working fluid 370 from the first liquid inlet 310 into the liquid-cooled heat sink head 100, the working fluid 370 flows downwardly to the through hole 220 formed by the opening of each heat dissipation fin 200, then flows to the liquid passages 210, and is converged towards the passageway 350 and outputted from the liquid outlet 320. During this period, the working fluid 370 is less obstructed by the heat dissipation fins 200, and can move closer to the heating element (not illustrated) to transfer away the waste heat thereof to achieve quick and efficient heat dissipation.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A liquid-cooled heat sink head, including a heat exchange portion for contacting a heat source, the liquid-cooled heat sink head comprising:
    a metal substrate, the heat exchange portion being disposed thereon;
    a first cover covering the metal substrate to form a heat exchange chamber, the first cover including a first liquid inlet and a liquid outlet to allow a working fluid to flow in the heat exchange chamber; and
    a plurality of heat dissipation fins disposed on the metal substrate and in the heat exchange chamber, the heat dissipation fins being disposed between the first liquid inlet and the liquid outlet and arranged sequentially from the first liquid inlet toward the liquid outlet, a liquid passage being disposed between each two adjacent ones of the heat dissipation fins, wherein at least a portion of the heat dissipation fins is connected to the heat exchange portion, at least one of the heat dissipation fins has a perforation spaced a distance from a top edge of the at least one of the heat dissipation fins opposite to a bottom edge thereof which is connected to the heat exchange portion, the liquid passages at two opposite sides of the at least one of the heat dissipation fins communicate with each other through the perforation, and the at least one of the heat dissipation fins having the perforation is disposed closer to the first liquid inlet than other heat dissipation fins of the plurality of heat dissipation fins to the first liquid inlet;
    wherein the plurality of heat dissipation fins include a first heat dissipation fin and a last heat dissipation fin, the first heat dissipation fin is disposed closer to the first liquid inlet than other of the plurality of heat dissipation fins to the first liquid inlet, the last heat dissipation fin is disposed closer to the liquid outlet than other of the plurality of heat dissipation fins to the liquid outlet, and at least the last heat dissipation fin includes no perforation.

2. The liquid-cooled heat sink head of claim 1, wherein the perforation is rectangular or circular in shape.

3. The liquid-cooled heat sink head of claim 1, wherein some of the heat dissipation fins have the perforation, the perforations are in the same position to form a through hole passing through the some of the heat dissipation fins.

4. The liquid-cooled heat sink head of claim 1, wherein at least one side of the heat dissipation fins is spaced apart from an inner surface of the first cover at the same side with a predetermined distance, so as to form a passageway in the heat exchange chamber.

5. The liquid-cooled heat sink head of claim 1, further comprising:
    a second cover covering the first cover to form a pump chamber, the pump chamber communicating with the heat exchange chamber via the first liquid inlet, the second cover including a second liquid inlet to allow the working fluid to flow into the pump chamber from the second liquid inlet; and
    a rotating wheel unit disposed in the pump chamber to forcibly direct the working fluid in the pump chamber into the heat exchange chamber via the first liquid inlet.

6. A heat sink system, comprising:
    the liquid-cooled heat sink head of claim 1;

a plurality of pipes, at least a portion of the pipes being connected to the first liquid inlet and the liquid outlet respectively; and a cooling device connected to the liquid-cooled heat sink head via the pipes to further cool the heat-exchanged working fluid.

7. The heat sink system of claim 6, further comprising:
a rotating wheel unit connected to the liquid-cooled heat sink head via the at least a portion of the pipes to forcibly direct the working fluid into the heat exchange chamber.

8. The heat sink system of claim 7, wherein the perforation is rectangular or circular in shape.

9. The heat sink system of claim 7, wherein some of the heat dissipation fins have the perforation, the perforations are in the same position to form a through hole passing through the some of the heat dissipation fins.

10. The heat sink system of claim 7, wherein at least one side of the heat dissipation fins is spaced apart from an inner surface of the first cover at the same side with a predetermined distance, so as to form a passageway in the heat exchange chamber.

11. A liquid-cooled heat sink head, including a heat exchange portion for contacting a heat source, the liquid-cooled heat sink head comprising:

a metal substrate, the heat exchange portion being disposed thereon;

a first cover covering the metal substrate to form a heat exchange chamber, the first cover including a first liquid inlet and a liquid outlet to allow a working fluid to flow in the heat exchange chamber; and a plurality of heat dissipation fins disposed on the metal substrate and in the heat exchange chamber, the heat dissipation fins being disposed between the first liquid inlet and the liquid outlet and arranged sequentially from the first liquid inlet toward the liquid outlet, a liquid passage being disposed between each two adjacent ones of the heat dissipation fins, wherein at least a portion of the heat dissipation fins is connected to the heat exchange portion, at least one of the heat dissipation fins has a perforation spaced a distance from a top edge of the at least one of the heat dissipation fins having the perforation opposite to a bottom edge thereof which is connected to the heat exchange portion, the liquid passages at two opposite sides of the at least one of the heat dissipation fins having the perforation communicate with each other through the perforation, and the at least one of the heat dissipation fins having the perforation is disposed closer to the first liquid inlet than other heat dissipation fins of the plurality of heat dissipation fins to the first liquid inlet;

wherein at least one of the heat dissipation fins includes no perforation.

12. A liquid-cooled heat sink head, including a heat exchange portion for contacting a heat source, the liquid-cooled heat sink head comprising:

a metal substrate, the heat exchange portion being disposed thereon;

a first cover covering the metal substrate to form a heat exchange chamber, the first cover including a first liquid inlet and a liquid outlet to allow a working fluid to flow in the heat exchange chamber; and a plurality of heat dissipation fins disposed on the metal substrate and in the heat exchange chamber, the heat dissipation fins being disposed between the first liquid inlet and the liquid outlet and arranged sequentially from the first liquid inlet toward the liquid outlet, a liquid passage being disposed between each two adjacent ones of the heat dissipation fins, wherein at least a portion of the heat dissipation fins is connected to the heat exchange portion, at least one of the heat dissipation fins has a perforation spaced a distance from a top edge of the at least one of the heat dissipation fins opposite to a bottom edge thereof which is connected to the heat exchange portion, the liquid passages at two opposite sides of the at least one of the heat dissipation fins communicate with each other through the perforation, and the at least one of the heat dissipation fins having the perforation is disposed closer to the first liquid inlet than other heat dissipation fins of the plurality of heat dissipation fins to the first liquid inlet;

wherein the first cover includes only one stop plate being parallel to the plurality of heat dissipation fins, the stop plate is disposed between the plurality of heat dissipation fins and the liquid outlet, and the stop plate extends from an inner top surface of the first cover toward the heat exchange chamber.

13. A heat sink system, comprising:
the liquid-cooled heat sink head of claim 12;
a plurality of pipes, at least a portion of the pipes being connected to the first liquid inlet and the liquid outlet respectively; and
a cooling device connected to the liquid-cooled heat sink head via the pipes to further cool the heat-exchanged working fluid.

* * * * *